(12) United States Patent
Zak

(10) Patent No.: US 8,169,214 B2
(45) Date of Patent: May 1, 2012

(54) ANGULAR POSITION SENSOR

(75) Inventor: Mark Zak, Sun Valley, CA (US)

(73) Assignee: Hydro-Aire, Inc., Burbank, CA (US)

( * ) Notice: Subject to any disclaimer, the term of this patent is extended or adjusted under 35 U.S.C. 154(b) by 591 days.

(21) Appl. No.: 12/134,524

(22) Filed: Jun. 6, 2008

(65) Prior Publication Data

US 2009/0315541 A1    Dec. 24, 2009

Related U.S. Application Data

(60) Provisional application No. 60/933,340, filed on Jun. 6, 2007.

(51) Int. Cl.
    *G01B 7/30*    (2006.01)

(52) U.S. Cl. ............... 324/207.25; 324/207.2; 324/160; 324/161; 324/162; 324/163; 324/164; 324/165; 324/166; 324/167; 324/168; 324/169; 324/170; 324/171; 324/172; 324/173; 324/174; 324/175; 324/176; 324/177; 324/178; 324/179; 324/180; 702/145; 702/146; 702/147; 702/148; 702/151; 33/1 PT; 33/1 N

(58) Field of Classification Search ............... 324/207.2, 324/207.25, 160–180; 702/145–148, 151; 33/1 PT, 1 N
See application file for complete search history.

(56) References Cited

U.S. PATENT DOCUMENTS

| | | | |
|---|---|---|---|
| 3,188,860 A * | 6/1965 | Roberts ................. | 33/1 PT |
| 4,095,348 A * | 6/1978 | Kramer ................. | 33/363 K |
| 4,449,191 A * | 5/1984 | Mehnert ................. | 702/94 |
| 4,584,577 A * | 4/1986 | Temple ................. | 340/870.32 |
| 4,746,862 A * | 5/1988 | Ueki ................. | 324/207.25 |
| 4,972,354 A * | 11/1990 | Hauck et al. ................. | 702/151 |
| 5,038,489 A * | 8/1991 | Muehlenbein ................. | 33/512 |
| 5,311,666 A * | 5/1994 | Jacobsen et al. ................. | 33/1 PT |
| 5,636,014 A * | 6/1997 | Hanson ................. | 356/28 |
| 5,670,872 A * | 9/1997 | Van De Walle et al. ................. | 324/171 |
| 5,696,442 A * | 12/1997 | Foster et al. ................. | 324/173 |
| 5,825,178 A * | 10/1998 | Hipp et al. ................. | 324/207.2 |
| 5,998,989 A * | 12/1999 | Lohberg ................. | 324/174 |
| 6,041,647 A  | 3/2000 | Matsuoka | |
| 6,364,050 B1* | 4/2002 | Horton ................. | 180/446 |
| 6,577,984 B1* | 6/2003 | Clairet et al. ................. | 702/151 |
| 6,618,688 B2* | 9/2003 | Schödlbauer ................. | 702/151 |
| 6,690,159 B2* | 2/2004 | Burreson et al. ................. | 324/207.23 |
| 6,848,187 B2* | 2/2005 | Ito et al. ................. | 33/1 PT |
| 6,885,188 B2* | 4/2005 | Russell ................. | 324/166 |

(Continued)

FOREIGN PATENT DOCUMENTS

DE    4021105 A1    2/1991

(Continued)

OTHER PUBLICATIONS

International Search Report issued Oct. 7, 2008, pp. 1-5.

*Primary Examiner* — Huy Q Phan
*Assistant Examiner* — Lamarr Brown
(74) *Attorney, Agent, or Firm* — Fulwider Patton LLP

(57) ABSTRACT

An angular position sensor and method that relies on a stationary circular array of Hall sensors and a rotatable circular array of magnets arranged about a common axis. A periodic and simultaneous reading of all of the Hall sensor outputs is used to determine angular velocity.

12 Claims, 1 Drawing Sheet

U.S. PATENT DOCUMENTS

| | | | |
|---|---|---|---|
| 7,075,290 B2 * | 7/2006 | Collier-Hallman et al. | 324/163 |
| 7,085,638 B2 * | 8/2006 | Knoll | 701/41 |
| 7,208,939 B2 * | 4/2007 | Frederick et al. | 324/207.25 |
| 7,405,554 B2 * | 7/2008 | Yao | 324/160 |
| 7,752,765 B2 * | 7/2010 | Shapiro | 33/471 |
| 2001/0009367 A1 * | 7/2001 | Seitzer et al. | 324/207.21 |
| 2002/0190709 A1 * | 12/2002 | Frederick et al. | 324/207.2 |
| 2003/0001565 A1 * | 1/2003 | Hoekstra | 324/207.21 |
| 2003/0023400 A1 * | 1/2003 | Sanpei et al. | 702/151 |
| 2004/0004471 A1 * | 1/2004 | Haas et al. | 324/207.2 |
| 2005/0162154 A1 * | 7/2005 | Mol et al. | 324/174 |
| 2005/0283968 A1 * | 12/2005 | Bauer | 29/527.3 |
| 2006/0009924 A1 * | 1/2006 | McGee et al. | 702/41 |
| 2006/0208727 A1 * | 9/2006 | Matsumoto et al. | 324/207.25 |
| 2007/0170913 A1 * | 7/2007 | Yokotani et al. | 324/207.22 |
| 2008/0245142 A1 * | 10/2008 | Bowling et al. | 73/114.26 |
| 2010/0185412 A1 * | 7/2010 | Abe et al. | 702/151 |

FOREIGN PATENT DOCUMENTS

| | | |
|---|---|---|
| EP | 0395783 A | 11/1990 |
| FR | 2861458 A | 4/2005 |

* cited by examiner

ANGULAR POSITION SENSOR

CROSS-REFERENCES TO RELATED APPLICATIONS

This application claims priority from U.S. Provisional Application No. 60/933,340, filed 6 Jun. 2007, incorporated by reference in its entirety.

BACKGROUND OF THE INVENTION

1. Field of the Invention

The present invention is generally directed to an angular position sensor and more particularly pertains to a sensor that is capable of extremely accurate angular position determinations in very hostile environments.

2. Description of the Related Art

There are many applications in which the accurate determination of the angular position of one component relative to another is critical. Moreover, accurate determination of angular position allows for the accurate calculation of angular speed and acceleration which is vital, for example, for the effective operation of high performance anti-lock or anti-skid braking systems. The components of braking systems may be subjected to fairly extreme conditions, including high temperatures, vibration and shock loads, as well as water and dirt contamination. Such conditions are further amplified in aircraft applications.

Certain previously known aircraft anti-skid systems have relied on a driveshaft to distance a relatively fragile sensor from the harsh conditions that exist immediately adjacent the brakes and wheel. While such a configuration allows for the use of a reliable and accurate inducer to generate the required wheel speed data, the weight, bulk and complexity of such a system is disadvantageous. A system relying on low frequency RF signals to generate wheel position and speed data has been employed. The use of Hall sensors has also previously been proposed, but the configurations that had been considered rendered the sensors particularly susceptible to heat damage and required an inordinate number of magnets and sensors in order to achieve the desired accuracy.

An angular position sensor is needed that this capable of generating extremely accurate position data for use in for example angular speed and/or acceleration calculations. Moreover, the sensor needs to be capable of reliably functioning in extremely hostile environments.

SUMMARY OF THE INVENTION

The present invention overcomes the disadvantages inherent in previously known angular position sensors to provide for highly accurate position data in extremely hostile environments. The device is robust and does not require direct coupling between rotating components. As such it is ideally suited for generating wheel speed data in aircraft applications.

The device in accordance with the present in invention generally comprises a plurality of permanent magnets that are arranged in an array that is attached to a rotating component. A fixed array of Hall sensors is arranged adjacent thereto and spaced therefrom. Preferably, the number of Hall sensors exceeds the number of magnets. Each of the Hall sensors generates an analog signal that is indicative of its proximity to a magnet. By simultaneously sampling the signal generated by each Hall sensor, an extremely accurate determination of the angular position of the array of magnets relative to the array of sensors may be calculated.

These and other advantages of the present invention will become apparent from the following detailed description of preferred embodiments which, taken in conjunction with the drawings, illustrate by way of example the principles of the invention.

DETAILED DESCRIPTION OF THE PREFERRED EMBODIMENTS

Figure 1:
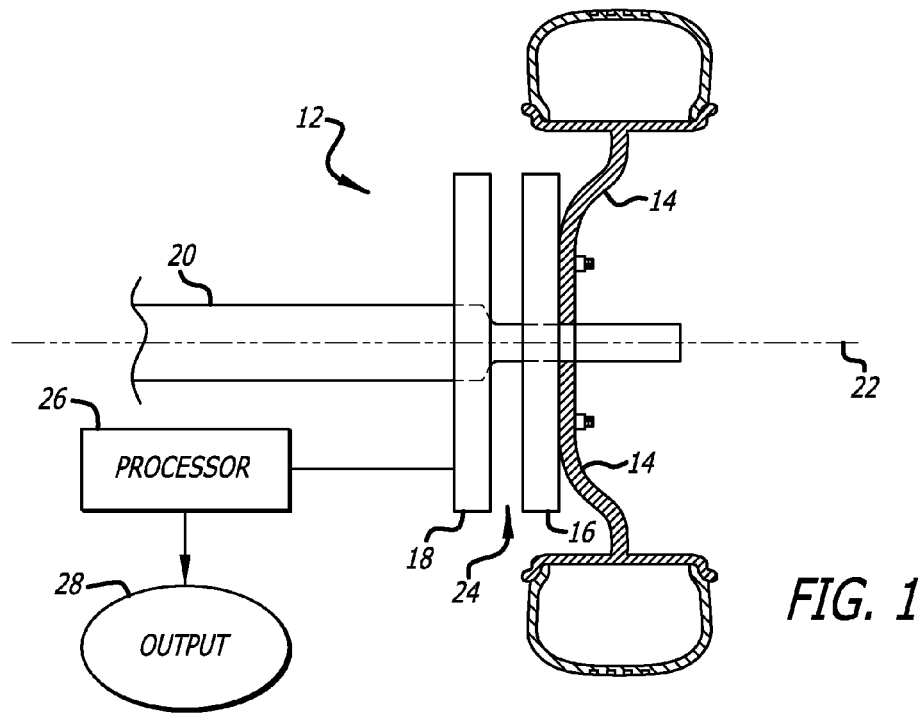
FIG. 1 is a schematic illustration of a angular position sensor in accordance with the present invention.

The present invention is directed to an angular position sensor which may readily be adapted to, a wheel, for example, and used to control an antilock or antiskid braking system for such wheel. The system 12 is very generally and schematically illustrated in FIG. 1. wherein a wheel 14 has a target plate 16 associated with it so as to rotate in unison, while a stationary sensor board 18 is affixed to a non-rotating axle 20 or other support element. In a presently preferred embodiment, a circular target plate and circular sensor board are centered about a common axis 22 and are separated by a small air gap 24. One or more processors 26 convert data generated by the sensor board to a useable output such as angular position, rate of rotation or wheel speed.

Figure 2:
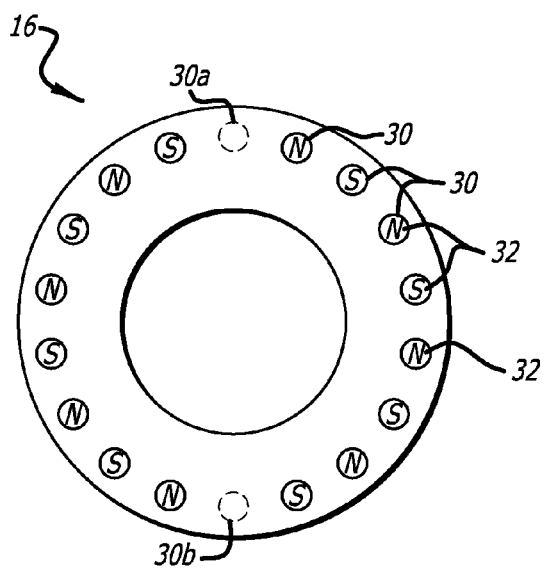
FIG. 2 is a schematic illustration of the target plate.
Figure 3:
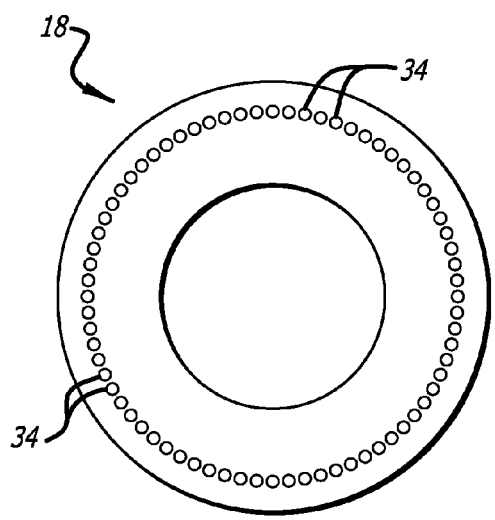
FIG. 3 is a schematic illustration of the sensor board.

In the preferred embodiment schematically illustrated in FIG. 2, the target plate 16 has a total of eighteen magnet positions 30 that are equidistantly distributed about its periphery in 20 degree increments wherein sixteen of such positions are occupied by magnets 32 that are arranged in an alternating North-South polarity sequence. Two magnet positions 30a and 30b remain unoccupied and are arranged 180 degrees relative to one another.

FIG. 2 schematically illustrates the sensor board 18 which supports a total of 72 Hall effect sensing elements 34 that are equidistantly distributed about its periphery in five-degree increments. Each Hall sensor generates an analog signal in proportion of the magnetic field strength it is subjected to. The target board and sensor board are positioned such that an approximately one-half inch air gap 24 is maintained there between.

A simultaneous reading of all 72 Hall sensors is periodically taken and an algorithm is relied upon to convert this data to a relative rotational angle between the sensor board and target board and hence wheel. Two such reading, a known time apart will yield the average wheel speed during that interval. The nominal time interval is 5 msec for 200 complete speed readings per second.

The Hall sensors output a voltage of from 0 to 5 volts that is proportional to the strength of the magnetic field at each Hall sensors position. A 2.5 volt signal is a null value or no field. A higher level toward 5 volts is a South field and a level towards 0 volts is a North field. The magnet strength and Hall sensor gap spacing is set such that 5 volts or 0 volts is never reached (no sensor saturation).

The processor which may or may not be positioned on the sensor board has circuitry to freeze the instantaneous values of all the Hall sensors' voltages at a precise moment, and hold them until each voltage can be converted to a digital number. This results in a Hall voltage data set or "snapshot" taken at the moment the Halls were frozen. After this conversion, which takes less than 1 msec, the Hall circuits are allowed to again track the Hall sensor outputs and be ready for the next sampling. The data from the Hall sensors is 12 bit unsigned number between 0 and 4096 counts, the latter corresponding the 5 volts. The null value is a nominal count of 2048.

Normalization of the Hall sensors' outputs is necessary as each Hall sensor has a random gain and DC offset variance of several percent from one device to another. The algorithm used for such normalization is very tolerant of unequal magnets in the magnet ring but not tolerant of Hall sensors with different gains. The goal of normalization is to find dynamically each individual Hall sensor's gain and offset so that correction factors can be maintained in the software to create the equivalent of a matched set of Hall devices. This normalizing procedure also automatically takes care of any biases or differences in the hardware multiplexers, op-amps and A to D converters. The Hall sensors produce a 2.5 volt output for no magnetic field, a voltage higher than this toward 5 volts for a south field, and a voltage lower than this towards 0 volts for a north field. The output is a linear voltage proportional to the magnetic field. The magnets and mechanical gap is sized such that the sensors never saturate (i.e. output never reaches 0 or 5 volts). From the software side, a ADC count of 0 is full North field, a count of 2048 is a zero field, and a count of 4096 is full South field. In practical operation, the field strength never gets more than about ½ to ⅔ of the way to full scale. For each of the 72 Hall sensors a running average is kept in software memory of all the Hall voltage values. This average voltage of count value is equal to that Hall sensors nominal DC offset voltage. This average will be affected somewhat by the magnets in the specific magnet ring used. If the South magnets used in a given ring are stronger than the North magnets, the count average value as the ring rotates will be higher than 2048 counts, but because all of the magnets rotate past all the 72 Hall sensors, the goal is to match the sensors to each other, not set their true volts output vs. gauss relationship. Once this average "zero" point for a Hall sensor is determined with regard to a particular magnet ring, all new samples are nonetheless used to update this average. In addition, each new Hall value is sorted out as a "South" value or a "North" value by a simple comparison to the Hall specific average. For example if the Hall specific "zero" value is 2050 counts and a new count is 2051, it is a "South" value. If 2049 it is a "North" value. The North and South values are then averaged into their own running averages. As a consequence, for each of the 72 Hall sensors, three running averages are kept—the South, Null and North averages. Instead of actual averages, the values are actually fed into simple software first order filters with adjustable time constants. The outputs of these filters are used such that the Null filter output is the Hall specific DC offset value. The South filter minus the North filter is the relative Hall specific gain. All the Hall specific DC offsets are added together and averaged. This is the overall system DC offset average for that given Hall data board and magnet ring combination. All the Hall specific gains are similarly averaged to give the system gain average. Each specific Hall offset is compared to the average to get a offset normalizing factor for that Hall. The same is done to get a gain normalizing factor for that Hall. These gain and offset normalizing factors are then applied to all raw Hall data to normalize the Hall sensors to each other before this data is fed to the Fourier algorithm for wheel angular position determination. Only the raw Hall values are used for input into for normalizing filters.

In practice, there is a low speed cut off for the normalizing filters as this normalizing cannot be done without wheel motion and in fact the filters will build up large gain and offset errors if this is attempted. In the currently preferred embodiment, normalizing filter integrations are suspended below 6 knots, maintaining the output values at their last value. The filter output values will be periodically stored in NVM so that all the Halls will have a baseline normalization upon system power up with no wheel rotation speed. The first order filters have time constants of about 30 seconds or so (adjustable for best performance) with the Null filter having twice the TC of the North or South filters as it's integration rate is twice as fast. This normalization serves to nearly triple the fine speed accuracy of the system.

A simple Fourier method is then used to find the rotation angle between the rotating magnet target on the wheel and the non-rotating Hall sensor board. The permanent magnets on a target plate attached to the rotating wheel, are placed in an alternating North South pattern to simulate a rough sine wave magnetic pattern as seen from a fixed point (i.e., a Hall sensor). There are 18 magnet positions so the magnetic sine wave pattern has nine complete sine waves in one 360 degree wheel revolution. This magnetic pattern is sampled at 72 points around the magnet ring by the Hall sensors. This is analogous to a periodic time function being sampled at 72 time increments in each repeating waveform period. Each value in the set of 72 magnetic samples is multiplied by a true sine function value and summed together. This is repeated with a cosine function. The two summations are divided to yield a tangent function term. The arc tangent of this term is the phase angle of the test waveform (magnet ring pattern) compared to the reference sin and cosine waveforms. This is the same as a sine/cosine Fourier transform, except only the phase of the fundamental frequency is of interest. The non-sine like variations of the pattern produced by the magnets can be thought of as just higher order harmonics of the fundamental and drop out of the calculation. This gives this method high tolerance for non-perfect sine wave patterns produced by discrete magnets.

A pseudo code example of this algorithm is as follows:

```
For a given Hall sensor sample space (one Hall sensor board capture)
we have Hall(n) for n = 1 to 72
    For the sine and cosine reference waves, there are 72 / 9 or eight
sine samples as there are 72 Hall sensors around the board and the
magnetic pattern repeats nine times per revolution. These eight samples
have only three fixed +/- values and are: 0, 1 / SQR(2) and 1
    Sin(1) = 0                    Cos(1) = 1
    Sin(2) = 0.707                Cos(1) = 0.707
    Sin(3) = 1                    Cos(1) = 0
    Sin(4) = 0.707                Cos(1) = -0.707
    Sin(5) = 0                    Cos(1) = -1
    Sin(6) = - 0.707              Cos(1) = - 0.707
    Sin(7) = - 1                  Cos(1) = 0
    Sin(8) = - 0.707              Cos(1) = 0.707
    SinSum = 0
    CosSum = 0
    Do for m = 1 to 9
    Do for n = 1 to 8
    SinSum = SinSum + Sin(n) × Hall[n + (m−1) × 8]
    CosSum = CosSum + Cos(n) × Hall[n + (m−1) × 8]
    end Do n
    end Do m
    Flip = 1
    If CosSum = 0
    Then: Ratio = 0
    Flip = −1
    end Then
    Else: Ratio = SinSum / CosSum
    If Absolute value (Ratio) > 1
    Then: Flip = − 1
    Ratio = CosSum / SinSum
    end Then
    end Else
    If Flip = −1 and SinSum < 0 then: Quadrant = 0
    If Flip = 1 and CosSum < 0 then: Quadrant = 1
```

```
If Flip = − 1 and SinSum > 0 then Quadrant = 2
If Flip = 1 and CosSum > 0 then: Quadrant = 3
W_Angle = − Flip × Arctan [Ratio]
Inter_Angle = 90 × Quadrant + W_Angle
```

Because this will repeat nine times per revolution, the resultant value merely comprises an intermediate angle calculation and the determination of a single 0 to 360 degree output of wheel position cannot be done directly. Accordingly, the fact that two of the magnet positions are devoid of magnets allows a specific sector of the nine sectors to be identified. It has been found, that the deletion of these two magnets has negligible effect on the accuracy of the Fourier phase angle result.

The purpose of this algorithm is to find which of the nine sectors of a rotation the wheel is currently in. This is needed as the Hall magnetic pattern repeats nine times per revolution and a 0 to 360 degree output is desired. Using the Fourier output of 0 to 40 degrees added to the sector or "group" number in 40 degree increments gives a true 0 to 360 degree result for each sample with no history from previous samples needed. The method makes the use of the fact the two of the 18 magnets are missing 180 degree apart in the magnets ring. Both of these holes are detected by this algorithm to find the Hall group number 1 to 9.

Nine groups of 8 Halls each are summed together to yield group sums 1 to 9n starting sequentially with Hall #1 in ascending Hall order. Group #1 is the sum of Halls 1 to 8. 9 sub groups are also summed for groups of 8 Halls with a 4 Hall offset so that subgroup 1 is the sum of Halls 5 to 12.

Because of the alternating polarity of the magnets and the Hall spacings, the sums for each group will tend to average out to the null magnetic value of 2048 counts or ½ the Hall sensors nominal output. If a missing magnet is in the group of eight Halls being summed, the sum will be significantly larger for the missing North magnet and significantly smaller than this null value for a missing South magnet. This method looks for both North and South missing magnets simultaneously for maximum robustness and noise rejection.

Because of the odd number of groups (9), if a one missing magnet is in the middle of group 1, the other missing magnet 180 degrees away will be exactly between groups 5 and 6 but this second missing magnet will be right in the middle of sub-group 5 because of the 4 Hall offset in the summation. To account for boundary conditions when the missing magnet is near the edge of two groups, the "quadrant" variable from the Fourier calculation is reused in the group detection logic. There are then 9 summation results 1 to 9 for the group sums and 9 summations 1 to 9 for the sub group sums.

These results are then subtracted in the following way:

```
For a Angle result in Quadrant 2 or 3:
Result(x) = Group(x) − Subgroup(x+ 4)
For an angle in quadrant 1 or 4:
Result(x) = Subgroup(x) − Group(x+ 5)
The final Group number is then the positive largest Result
  number
Lastly, if Quadrant = 4 then Group is incremented by one.
This algorithm is described by the following pseudo code:
Normalized Hall voltage counts (0 to 4096) equal HallNorm(1 to 72)
Do for m = 1 to 9
Do for n = 1 to 8
Group sum(m) = Group sum(m) + HallNorm ( n + ( 8 × ([m − 1]))
end DO n
end DO m
The above results in the nine group sums
The subgroups are then:
Do for m = 1 to 9
Do for n = 1 to 8
If (n + ( 8 × [m − 1 ] ) + 4 ) > 72
Then: Over = 72
Else: Over = 0
SubGroupsum(m) = SubGroupsum(m) + HallNorm( n + ( 8 × [m −
  1 ]) + 4 − Over )
End DO n
End DO m
The "If" statement is because the next Hall after Hall # 72 on a
  circular board is Hall # 1
  Case: Quadrant is 2 or 3:
  GroupMax = 0
  Do n = 1 to 9
  m = n + 4
  If m > 9
  Then: m = m − 9
  Result(n) = Group(n) − SubGroup(m)
  If Result(n) > GroupMax
  Then: Group Number = n
  GroupMax = Result(n)
  End Then
  End DO n
  Group = Group Number
  End Case
  Case: Quadrant is 1 or 4:
  Do n = 1 to 9
  m = n + 5
  If m > 9
  Then: m = m − 9
  Result(n) = SubGroup(n) − Group(m)
  If Result(n) > GroupMax
  Then: Group Number = n
  GroupMax = Result(n)
  End Then
  End DO n
  If Quadrant = 4 then: Group = Group Number
  If Quadrant = 1 then: Group = Group Number + 1
  If Group = 10 then: Group = 1
  End Case
  Term "Group" now contains the correct group number 1 to 9
  Final Composite angular position:
  Now knowing the "Group" the final composite wheel angle from 0 to
  360 degrees is:
  Angle = ( 40 × Group ) + ( Inter_Angle / 9 )
  For Wheel Speed:
  The wheel speed is a simple average of the speed between over the
sample time interval given by:
  Degrees/second = ( Angle(new) − Angle(last) ) / ( time difference
between new and last)
  Feet/second = ( Wheel/diameter × PI × Degrees/second) / 360
```

It is to be noted that reverse speeds are detectable and show as a negative speed.

The described angular position sensor allows for a very precise angle determination and consequently, the calculation of a very precise angular velocity. This is especially desirable for use in anti-skid or anti-lock braking systems. The robust nature of the described device renders it especially well suited for aircraft applications. Also, those skilled in the art will recognize that, while a circular arrangement of Hall devices and magnets have been described, other arrangements of the arrays of Hall devices and magnets may provide advantages in certain applications. Also, those skilled in the art will recognize that, while a circular arrangement of Hall devices and magnets have been described, other arrangements of the arrays of Hall devices and magnets may provide advantages in certain applications.

While a particular form of the invention has been described and illustrated, it will also be apparent to those skilled in art that various modifications can be made without departing from the spirit and scope of the invention. Accordingly, it is not intended that the invention be limited except by the appended claims.

The invention claimed is:

1. An angular position sensor, comprising:
a circular sensor board including a stationary circular array of a plurality of Hall sensors, each having a radius and centered about an axis, equidistantly distributed about a periphery of said circular sensor board in 5 degree increments, wherein each of said plurality of Hall sensors is configured for generating an analog signal as a function of its proximity to a magnet;
a circular target plate including a rotatable array of a plurality of magnet positions centered about said axis and spaced apart from said stationary circular array, equidistantly distributed about a periphery of said circular target plate in 20 degree increments, wherein said plurality of Hall sensors exceeds said plurality of magnet positions, two of said plurality of magnet positions being devoid of magnets and spaced 180° relative to one another, and the remaining magnet positions of said plurality of magnet positions being occupied by magnets that are arranged in alternating North-South polarity sequence, whereby said two of said plurality of magnet positions devoid of magnets separate the magnets occupying the magnet positions on either side of said magnet positions devoid of magnets by 40 degree increments; and
a processor configured to relate signals simultaneously generated by said plurality of Hall sensors to an angular position of said rotatable array relative to said stationary circular array based upon a Fourier transform.

2. The angular position sensor of claim 1, wherein said stationary circular array comprises equally spaced Hall sensors with a common distance from a centerline of said axis.

3. The angular position sensor of claim 1, wherein said rotatable array of a plurality of magnet positions comprises eighteen equally spaced magnet positions.

4. The angular position sensor of claim 1, wherein said plurality of Hall sensors are normalized such that a given magnetic field strength causes all of said plurality of Hall sensors to generate a substantially identical analog signal.

5. The angular position sensor of claim 1, wherein said angular position is periodically determined to yield angular velocity.

6. The angular position sensor of claim 5, wherein said circular target plate including said rotatable array is affixed to a wheel, said circular sensor board including said stationary circular array is affixed to a non-rotating element adjacent said wheel and said determined angular velocity is used to prevent skidding.

7. A method for determining angular position, comprising:
providing a circular sensor board including a stationary array of a plurality of Hall sensors, each having a radius and centered about an axis, equidistantly distributed about a periphery of said circular sensor board in 5 degree increments, wherein each of said plurality of Hall sensors is configured for generating an analog signal as a function of its proximity to a magnet;
providing a circular target plate including a rotatable array of a plurality of equally spaced magnet positions having substantially said same radius, centered about said axis and spaced apart from said array of sensors, equidistantly distributed about a periphery of said circular target plate in 20 degree increments, two of said magnet positions being devoid of magnets and spaced 180° apart, and the remaining magnet positions of said plurality of magnet positions being occupied by magnets that are arranged in alternating North-South polarity sequence, whereby said two of said plurality of magnet positions devoid of magnets separate the magnets occupying the magnet positions on either side of said magnet positions devoid of magnets by 40 degree increments; and
relating said analog signals simultaneously generated by said Hall sensors to an angular position of said rotatable array relative to said stationary array based upon said two magnet positions devoid of magnets, wherein a Fourier transform is relied upon to relate said simultaneously generated signals into an angular position.

8. The method of claim 7, wherein said plurality of Hall sensors exceeds said plurality of magnets.

9. The method of claim 8, wherein said stationary array comprises 72 Hall sensors and said rotatable array comprises 18 magnet positions.

10. The method of claim 7, further comprising normalizing said Hall sensors wherein said signals generated by each of said plurality of Hall sensors are adjusted such that an average signal generated by each Hall sensor when adjacent each of said plurality of magnets is equal to the average signal generated by all other of said plurality of Hall sensors when adjacent each of said plurality of magnets.

11. The method of claim 7, further comprising determining angular velocity of said rotatable array relative to said stationary array by periodically sampling said signals simultaneously generated by said Hall sensors.

12. The method of claim 11, wherein said sampling occurs every 5 msec.

* * * * *